US012469701B2

(12) United States Patent
Lutker-Lee et al.

(10) Patent No.: US 12,469,701 B2
(45) Date of Patent: Nov. 11, 2025

(54) PATTERNING FEATURES WITH METAL BASED RESISTS

(71) Applicant: Tokyo Electron Limited, Tokyo (JP)

(72) Inventors: Katie Lutker-Lee, Albany, NY (US); Angelique Raley, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 695 days.

(21) Appl. No.: 17/658,538

(22) Filed: Apr. 8, 2022

(65) Prior Publication Data

US 2023/0326755 A1    Oct. 12, 2023

(51) Int. Cl.
*H01L 21/033* (2006.01)
*H01L 21/027* (2006.01)
*H01L 21/311* (2006.01)
*H01L 21/3213* (2006.01)

(52) U.S. Cl.
CPC ...... *H01L 21/0337* (2013.01); *H01L 21/0276* (2013.01); *H01L 21/0332* (2013.01); *H01L 21/0338* (2013.01); *H01L 21/31116* (2013.01); *H01L 21/31122* (2013.01); *H01L 21/31138* (2013.01); *H01L 21/31144* (2013.01); *H01L 21/32136* (2013.01); *H01L 21/32137* (2013.01); *H01L 21/32139* (2013.01)

(58) Field of Classification Search
None
See application file for complete search history.

(56) References Cited

U.S. PATENT DOCUMENTS

| | | | |
|---|---|---|---|
| 11,094,543 B1 | 8/2021 | Han et al. | |
| 2017/0271150 A1* | 9/2017 | Chang | G03F 7/11 |
| 2018/0068852 A1 | 3/2018 | Cottle et al. | |
| 2019/0198338 A1 | 6/2019 | Kim et al. | |
| 2020/0135487 A1* | 4/2020 | Lee | H01L 21/0337 |
| 2020/0319556 A1 | 10/2020 | Wang et al. | |
| 2021/0183656 A1 | 6/2021 | Lutker-Lee et al. | |

OTHER PUBLICATIONS

Ghewa Akiki et al, Area selective deposition of silicon by plasma enhanced chemical vapor deposition using a fluorinated precursor, Jul. 2020, Applied Surface Science, 531, pp. 1-4 (Year: 2020).*
International Search Report and Written Opinion; PCT Application No. PCT/US2023/016459, mailed Jul. 31, 2023, 11 pages.
Lapedus, Mark, "Where Is Selective Deposition?," Semiconductor Engineering, https://semiengineering.com/what-happened-to-selective-deposition/#:~:text=Meanwhile%2C%20there%20are%20three%20main,the%20Eindhoven%20University%20of%20Technology, Jun. 25, 2018, 10 pages.

* cited by examiner

*Primary Examiner* — Stephanie P Duclair
(74) *Attorney, Agent, or Firm* — Slater Matsil, LLP

(57) ABSTRACT

A method of forming a semiconductor device includes receiving a substrate in a plasma chamber, the substrate comprising an EUV patterned first mask material comprising a metal-based resist (MBR) and an underlying layer disposed between the substrate and the first mask material; depositing, selectively, a second mask material on the first masking layer using a first plasma comprising a source gas that reacts selectively with the first masking layer relative to the underlying layer; and etching the portion of the underlying layer to form a patterned underlying layer using the second masking layer and the first masking layer as an etch mask.

20 Claims, 6 Drawing Sheets

PATTERNING FEATURES WITH METAL BASED RESISTS

TECHNICAL FIELD

The present invention relates generally to patterning features, and, in particular embodiments, to a method for patterning features with metal based resists.

BACKGROUND

A semiconductor integrated circuit (IC) is fabricated by sequentially depositing and patterning various layers over a substrate using photolithography and etch to form a monolithic structure comprising electronic components connected by metal lines and vias. At each new technology node, the component packing density is doubled by shrinking feature sizes. A direct method for printing at a smaller pitch is to reduce the wavelength of the light source. The 193 nm $\lambda$ ArF deep ultraviolet (DUV) laser replaced the 248 nm $\lambda$ KrF laser at the 90 nm node and, by the time 14 nm node was in production, scaling enhancement techniques such as multiple patterning were needed to pattern the minimum pitch features with 193 nm lithography. However, that increases cost by adding process complexity and masking steps. To keep the cost manageable, 13.5 nm $\lambda$ extreme ultraviolet (EUV) lithography is being introduced at the sub-10 nm nodes. Early efforts to modify traditional organic chemically amplified resist (CAR) for EUV had many issues. Recently, a different class of resists, called metal-based resist (MBR), is commercially available for EUV lithography. Although MBR provides an improved RLS metric, RLS being an acronym for resolution, line width roughness, and sensitivity, the resist thickness still has to be reduced as feature sizes are scaled down to nanoscale dimensions. The thinner resist is necessary to avoid the structural instability of high aspect ratio of resist lines and pillars. Additionally, the reduced count of the higher energy EUV photons causes random defects, the defect density worsening with increasing resist height. A thinner etch mask has less masking ability; hence, further innovation is desired to improve the masking ability of EUV lithography.

SUMMARY

A method of forming a semiconductor device includes receiving a substrate in a plasma chamber, the substrate comprising an EUV patterned first mask material comprising a metal-based resist (MBR) and an underlying layer disposed between the substrate and the first mask material; depositing, selectively, a second mask material on the first masking layer using a first plasma comprising a source gas that reacts selectively with the first masking layer relative to the underlying layer; and etching the portion of the underlying layer to form a patterned underlying layer using the second masking layer and the first masking layer as an etch mask.

A method of forming a semiconductor device, the method includes depositing a layer of a first mask material including a metal-based resist (MBR), the layer covering an underlying layer of a substrate; patterning the first mask material using an extreme ultraviolet (EUV) lithography process to form a first masking layer and expose a portion of the underlying layer; and etching the underlying layer using cyclic process that includes: depositing a second mask material selectively on the first masking layer by exposing the substrate to a first plasma, the first plasma including a source gas that reacts selectively with the first masking layer relative to the underlying layer; and exposing the substrate to a second plasma.

A method of forming a semiconductor device, the method includes forming a lithography stack on a base layer on a substrate, the stack including a metal-based resist (MBR) layer and an underlying layer disposed below the MBR layer; patterning the MBR layer using an extreme ultraviolet (EUV) lithography process to form a patterned MBR layer and expose a surface of a portion of the underlying layer; depositing an overlying layer by exposing the substrate to a first plasma, the first plasma comprising a source gas that reacts preferentially with the MBR layer relative to the underlying layer, the overlying layer having a first thickness over a substantially flat top surface of the patterned MBR layer and a second thickness covering the exposed surface of the underlying layer, the first thickness being greater than the second thickness; exposing the substrate to a second plasma to etch a portion of the overlying layer to expose the surface of the underlying layer covered by the overlying layer covering the patterned MBR layer; exposing the substrate to a third plasma to etch the lithography stack in the plasma chamber to form a patterned lithography stack using the remaining portion of the overlying layer and the patterned MBR layer as a first etch mask.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
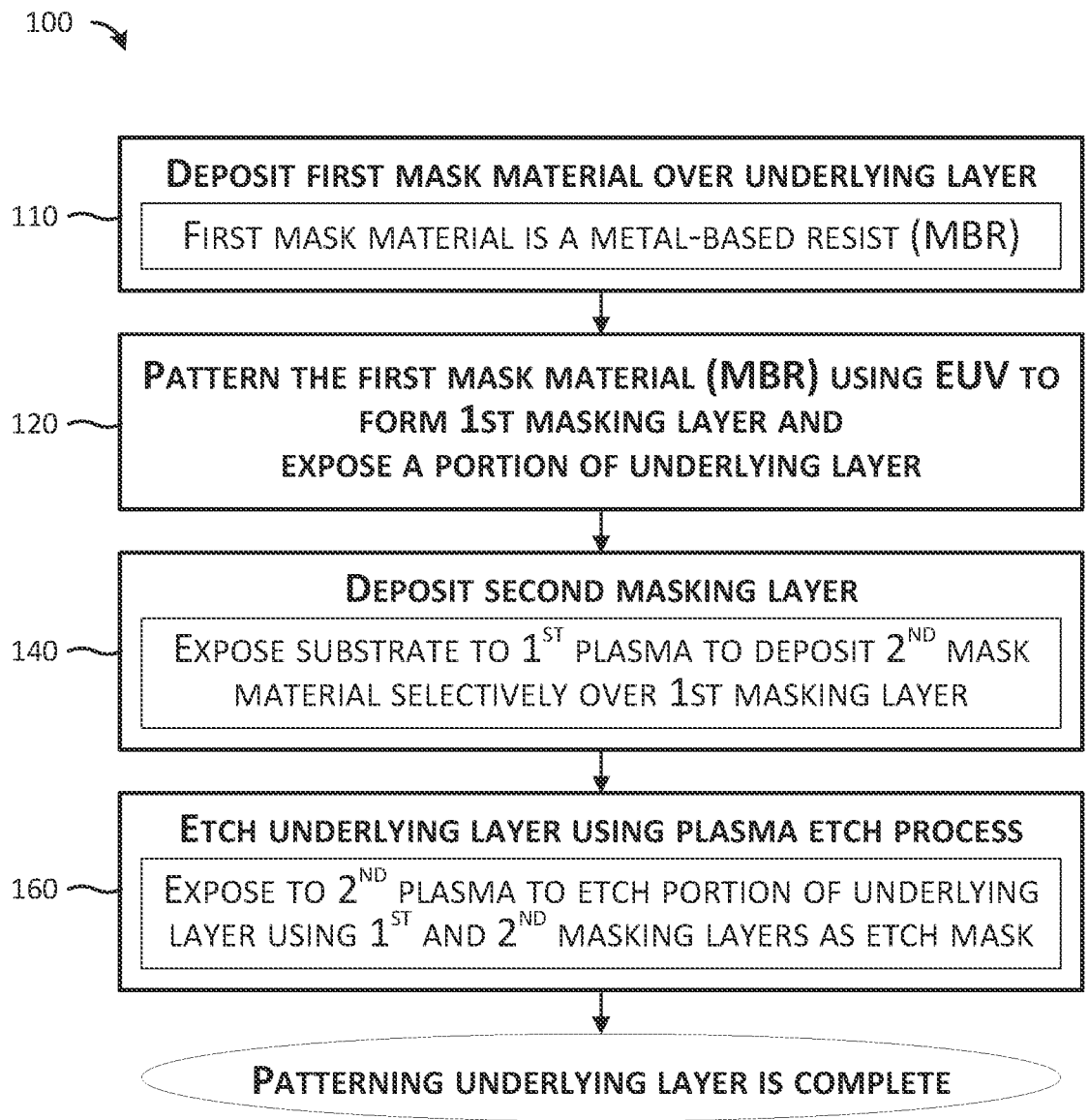
FIG. 1 illustrates a flowchart of a method for patterning an underlying layer disposed adjacent below a metal-based resist (MBR) layer, in accordance with some embodiment.

The present invention relates to methods for forming patterned features at a small pitch that may be close to or beyond the patterning capability of 193 nm $\lambda$ DUV lithography. The minimum pitch for a resist line-and-space pattern formed using 193 nm optics is about 75 nm, even with phase shift masks and immersion lithography techniques. The resolution limit of 193 nm $\lambda$ deep ultraviolet (DUV) lithography may be extended further but at the high cost of multiple patterning. The shorter 13.5 nm $\lambda$ extreme ultraviolet (EUV) lithography is being introduced at the sub-10 nm technology nodes to accommodate a scaling trend that is increasing the number of patterning levels at which the minimum pitch is about 20 nm to about 40 nm. With high numerical aperture optics, the minimum pitch may be scaled down further to about 10 nm. As known to persons skilled in the art, the resolution, line width roughness, and sensitivity (RLS) tradeoff of a traditional organic chemically amplified resist (CAR) is inadequate for EUV because the 14.3 times higher energy EUV photons are likely to penetrate through the CAR layer uncaptured. A class of hybrid organic-inorganic resists, referred to here as metal-based resist (MBR), is more promising for use in EUV lithography. The inorganic unit of the MBR, which includes the metal atoms, may be selected to enhance absorption of EUV photons, increase etch resistance, and provide higher mechanical strength. For these reasons, MBR is the most likely choice for EUV in production, and the example embodiments of patterning methods in this disclosure include forming a patterned MBR masking layer using an EUV lithography process.

The resist thickness affects many aspects of patterning with EUV radiation. There is an understandable trend towards thinner photoresist with reducing feature size. With resist linewidths reduced to the 10 nm to 20 nm range, the resist thickness gets limited by the increased aspect ratio of resist features. Narrow lines and tall pillars of resist may become structurally unstable. For example, consider a pattern of resist lines with unequal spaces on either side, resulting in unequal forces on the two opposite sides due to surface tension of the developer. At a high enough aspect ratio, the force misbalance may bend and even collapse some of the high aspect ratio resist features.

Random pattern variations (or stochastic defects) in resist features due to the inherently random number of photons absorbed per unit area is also affected by resist thickness. Number fluctuation is typically a Poisson process, where the variance is inversely proportional to the mean. This fluctuation phenomenon is often referred to as shot noise. At any fixed exposure dose, the average number of photons is inversely proportional to photon energy; hence, the higher energy of the EUV photon (92 eV vs. 6.4 eV) worsens the stochastic effects in resist layers patterned using EUV lithography. The average photon density at the surface of the resist is just 10 photons/$nm^2$ compared to 143 photons/$nm^2$ for 193 nm DUV at a typical 15 mJ/$cm^2$ exposure dose. The 14.3 ratio results in a percentage variation in the number of photons absorbed per unit area that is $\sqrt{(14.3)}$ times or, 3.8 times, larger for 13.5 nm EUV relative to that for 193 nm DUV lithography. Here, we assumed that the fraction of incident photons absorbed to be the same for the EUV and DUV resist but, in reality, the fraction may be smaller for EUV, thus making the percentage variation worse. Although the total photon absorption may be higher for a thicker resist, the change in radiation intensity, hence radiation absorption, along the height of the resist would become larger. Furthermore, a thicker resist implies fewer photons reaching the bottom, hence amplifying shot noise near the foot of the resist feature.

On the other hand, there are different problems if the resist is too thin. The resist loss during a pattern-transfer etch process used on a thin resist feature may compromise the masking ability of the resist, resulting in a patterning defect. The selectivity of the etch chemistry and the depth of the features in the layer to be patterned imposes a lower bound on the resist thickness. Additionally, the resist may not be completely exposed if the thickness is inadequate to capture a sufficient number of photons at a reasonable exposure dose. This may result in resist residue that has to be removed by an additional descum step. A higher photon count can be achieved by increasing the total dose by increasing exposure time, but it hurts throughput and manufacturing cost. Excessive radiation dose may also lead to various issues such as overheating and outgassing.

As EUV lithography progresses to even finer resolution using high numerical aperture (NA) optics, the process window for resist thickness shrinks. As explained above, generally, the maximum thickness of a patterned resist layer is constrained by structural integrity and vertical nonuniformity in photon density and, the minimum thickness is constrained by etch resistance to a pattern-transfer etch and a maximum exposure dose for manufacturability. It is anticipated that for high yielding volume manufacturing of ICs it may become increasingly important to identify EUV lithography processes having less stringent constraints for resist thickness.

The embodiments described in this disclosure, alleviate the constraint of etch resistance of a patterned MBR layer to an etch process used to transfer the pattern to an underlying layer disposed adjacent below the patterned MBR layer. In the example methods described in this disclosure, a second mask material is deposited on the patterned MBR layer, the MBR being the first mask material. The deposition process is an area selective deposition (ASD) that deposits the second mask material selectively over the first mask material. The selectivity may be achieved by a chemical reaction occurring selectively over the MBR relative to the underlying layer exposed by the patterned MBR layer. The deposition may be performed in a single deposition step in a plasma chamber, as in the example embodiment described with reference to FIG. 1 and FIGS. 2A-2D, or the deposition may be a part of each cycle of a cyclic deposition and etch process, as described with reference to FIG. 3 and FIGS. 4A-4F. In some embodiments, the chemical reaction dynamics may be such that a thickness of the second mask material is deposited over the exposed underlying layer although chemical reaction occurs preferentially over the patterned MBR layer to deposit a thicker overlying layer of the second mask material on a top surface of the patterned MBR layer. As described with reference to FIG. 5 and FIGS. 6A-6F, in such embodiments, an in situ plasma process is performed to remove a portion of the deposited second mask material. The etch process is adjusted to utilize the thickness differential to remove a portion of the second mask material to expose the underlying layer but leave a remaining portion to cover the patterned MBR layer.

As mentioned above, in some embodiments, the selective deposition is performed in a single deposition step in a plasma chamber. An example embodiment of this is described with reference to a flowchart and cross-sectional views of a semiconductor device at various intermediate stages of fabrication, illustrated in FIG. 1 and FIGS. 2A-2D, respectively.

FIG. 1 illustrates a flowchart of a patterning method 100 suitable for patterning features with a small pitch. As indicated in block 110 of the flowchart in FIG. 1 and in a cross-sectional view of a semiconductor device in FIG. 2A, a first mask material comprising MBR is deposited on an underlying layer 220, the deposition forming an MBR layer 200. In some embodiments, the MBR comprises a metal oxide nanoparticle or a nanocluster, the metal comprising hafnium, zirconium, titanium, tin, zinc, indium, or aluminum. The MBR may also include an organometallic complex, where the metal may be antimony, tin, bismuth, tellurium, platinum, palladium, cobalt, iron, or chromium.

The underlying layer 220 is typically a bottom antireflective coating (BARC) that may double as a hardmask layer for etching a portion of a layer below the underlying layer 220. Examples of materials used for forming the underlying layer 220 include spin-on glass (SOG), silicon-containing antireflective coating (SiARC), silicon carbide (SiC), silicon oxycarbide (SiOC), silicon carbonitride (SiCN), silicon oxycarbonitride (SiOCN), organic BARC, or a combination thereof.

Generally, the resist layer (e.g., the MBR layer 200) and the antireflective coating-cum-hardmask (e.g., the underlying layer 220) are layers of a sacrificial lithography stack that may be patterned and used as an etch mask to pattern a layer below the lithography stack that is included in a device structure. Sometimes, the layer adjacent below the lithography stack may be referred to as a base layer, for example, the layer disposed adjacent below the underlying layer 220 in FIG. 2A may be referred to as a base layer 230. Examples of materials used for forming the base layer 230 include silicon dioxide, carbon doped oxide, fluorosilicate glass, porous oxide, silicon nitride, silicon oxynitride, silicon, titanium nitride, titanium, tantalum nitride, tantalum, or a combination thereof. The rest of the layers of the substrate as well as the starting semiconductor wafer are included in a substrate layer 240, illustrated in FIG. 2A.

As indicated in block 120 of the flowchart in FIG. 1, the MBR layer 200 is patterned using an extreme ultraviolet (EUV) lithography process to form a patterned MBR layer, referred to as a first masking layer 210. The first masking layer 210 exposes a portion of the underlying layer 220, as illustrated in cross-sectional view in FIG. 2B.

After forming the first masking layer 210, the substrate is transferred to a plasma chamber. As indicated in the flowchart for method 100 a first plasma is used to deposit a second masking layer in the plasma chamber. The first plasma comprises a source gas that reacts chemically selectively with the first masking layer relative to the underlying layer. The substrate is exposed to the first plasma to deposit a second mask material selectively on the first masking layer, as indicated in block 140 of the flowchart. By proper selection of process parameters of the plasma deposition process, the chemical selectivity of the reaction may be utilized to perform an area selective deposition (ASD) process to form a second masking layer 214, as indicated in block 140 and illustrated in FIG. 2C. As illustrated in the cross-sectional view in FIG. 2C, the second mask material deposits over the first masking layer 210 (the patterned MBR layer), while a negligible thickness of the second mask material is formed over a portion of the underlying layer 220 not covered by the first masking layer 210. In some embodiments, forming the second masking layer 214 may include performing an optional in situ trim etch process that removes a portion of the deposited second mask material. In embodiments where the second mask material comprises a silicon-based material, the trim etch process may be a plasma etch using fluorocarbons, fluorine, chlorine, or hydrogen bromide as an etchant. In embodiments where the second mask material comprises an organic material, the etchant may comprise CO, $CH_4$, $CO_2$, $O_2$, or the like. One purpose for performing the trim etch process is to open a larger portion of the space between resist lines that may be covered by the second mask material along sidewalls of the lines.

Figure 2A:
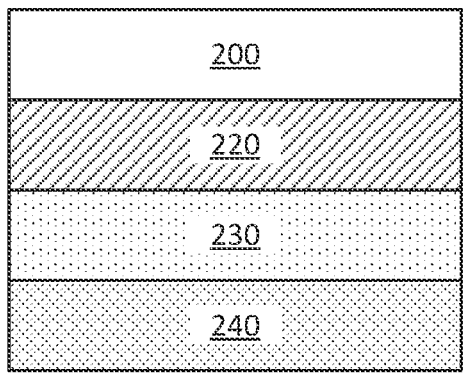
FIGS. 2A-2D illustrate cross-sectional views of a semiconductor device at various intermediate stages of processing for patterning an underlying layer using the method described in the flowchart illustrated in FIG. 1.
Figure 2B:
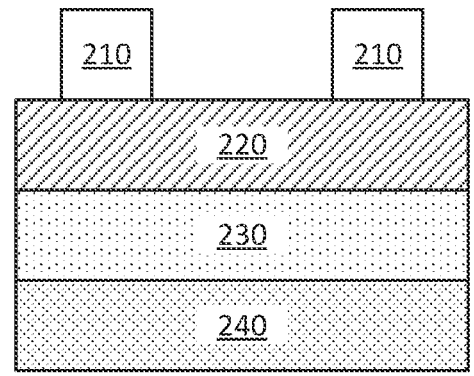
Figure 2C:
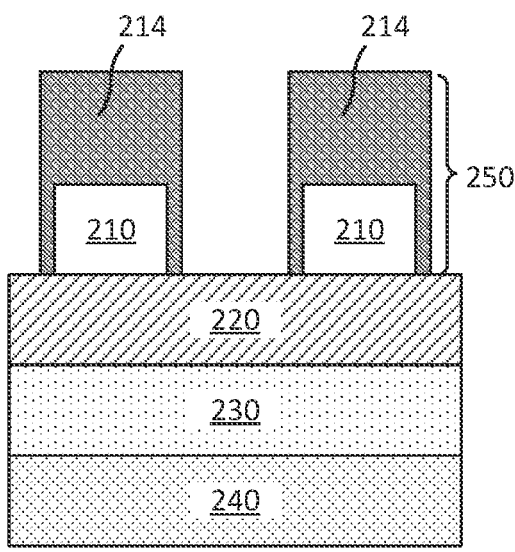

In the example embodiment illustrated in FIG. 2C, the completed second masking layer 214 has a thinner layer of the second mask material along a sidewall of the first masking layer 210 compared to a thickness of the second mask material over a substantially flat top surface of the first masking layer 210. The second mask material and the processes used to form the second masking layer 214 may be selected such that some of the roughness along the sidewall of the first masking layer 210 is smoothed out. The combined first masking layer 210 and the second masking layer 214 forms an etch mask 250 that may be used in a subsequent etch process to pattern the underlying layer 220. In various embodiments, the height of the first masking layer 210 may be about 5 nm to about 20 nm and the thickness of the second masking layer 214 over the top surface of the first masking layer 210 may be about 5 nm to about 20 nm. Similar thicknesses may be used in forming either an inorganic or an organic second masking layer 214.

In some embodiments, the ASD process is used to deposit an amorphous material comprising silicon as the second mask material. The first plasma used to deposit the silicon comprises silane ($SiF_4$) as the source gas and an inert gas (e.g., argon, nitrogen, or helium) as a diluent gas. In some embodiments using silane as the source gas, the first plasma may include additive gases such as $H_2$, $SiCl_4$, $CH_4$, $CH_xF_{4-x}$, or a mixture thereof.

Additionally, the gaseous mixture used for the first plasma may be selected to deposit an organic polymer as the second mask material. The first plasma used to deposit the organic polymer comprises carbon monoxide (CO) as the source gas and an inert diluent gas (e.g., argon, nitrogen, or helium). In some embodiments using CO as the source gas, the first plasma may include additive gases such as $H_2$, $CH_4$, $CH_xF_{4-x}$, $CO_2$, $O_2$, or a mixture thereof.

In various embodiments, the first plasma for the ASD process may use a high frequency (e.g. 10 MHz to 1 GHz) radio frequency (RF) source power or a low frequency (e.g. 100 Hz to 100 kHz) RF source power. The RF source power may be in a range from about 100 W to about 1.5 kW. The flow rate for the source gas may be from 2 sccm to about 250 sccm. The ASD process is performed at a controlled pressure and temperature. The pressure in the plasma chamber may be from about 5 mTorr to about 250 mTorr and the substrate temperature may be from about 0° C. to about 120° C.

Figure 2D:
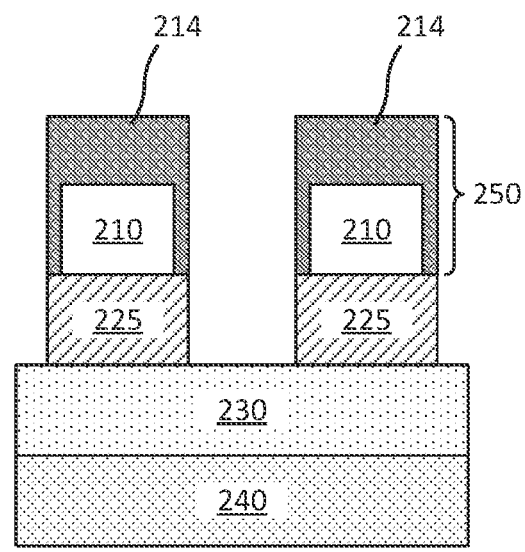

After the etch mask 250 comprising the first masking layer 210 and the second masking layer 214 has been formed, an etch process is performed (box 160 in the flowchart in FIG. 1) to transfer the pattern of the etch mask 250 to the underlying layer 220, thereby forming a patterned underlying layer 225. FIG. 2D illustrates a cross-sectional view of the substrate after the patterned underlying layer 225 has been formed.

In some embodiments, the underlying layer 220 may be etched in situ by a plasma etch process by generating a second plasma in the same plasma chamber where the first plasma was generated. In some other embodiments, the pattern transfer etch with the etch mask 250 may be performed after transferring the substrate to some other processing equipment. The second plasma comprises etchants that remove the material of the underlying layer 220. For example, if the underlying layer 220 comprises spin-on glass (SOG), silicon-containing antireflective coating (SiARC), silicon carbide (SiC), silicon oxycarbide (SiOC), silicon carbonitride (SiCN), or silicon oxycarbonitride (SiOCN), the second plasma may be using a fluorine based or a chlorine based etch chemistry. If the underlying layer comprises an organic BARC then the second plasma may comprise a fluorocarbon, HBr, $O_2$, $CO_2$, CO, or the like. The plasma etching comprises exposing the substrate to the second plasma for a fixed etch duration or terminating the etch process based on an endpoint signal. In some embodiments, the plasma etching may be a substantially anisotropic etching process. As illustrated in FIG. 2D, a portion of the etch mask 250 may be removed by the second plasma by the time the etch process is completed. In this example, a portion of the second masking layer 214 has been lost during etching. In some other example, the etching may remove the entire second masking layer 214 and, in some instances a portion of the first masking layer 210.

Figure 3:
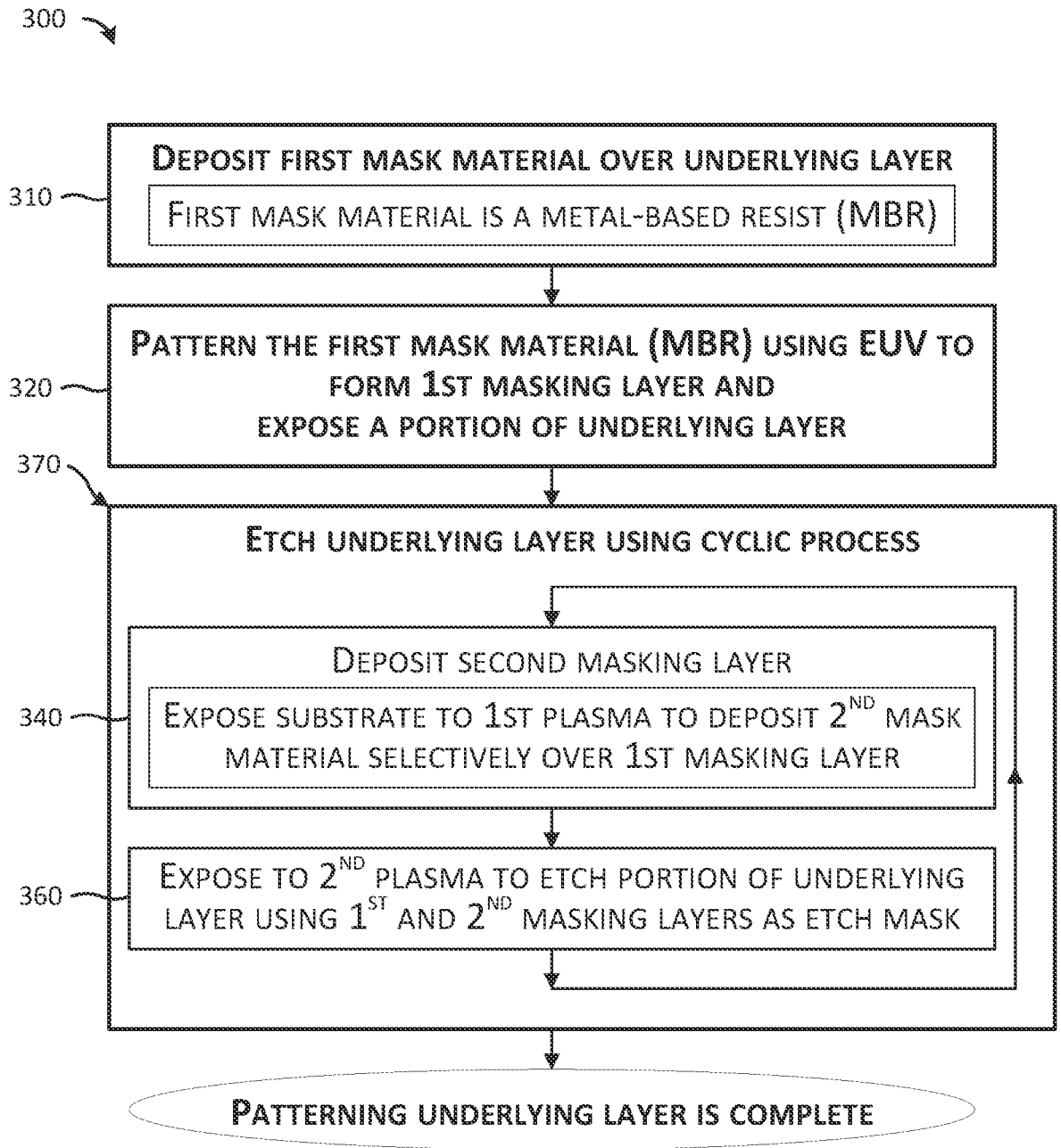
FIG. 3 illustrates a flowchart of a method for patterning an underlying layer disposed adjacent below a metal-based resist (MBR) layer, where the method includes a cyclic process, in accordance with some embodiment.

The method 100 described with reference to FIG. 1 and FIG. 2A-2D illustrate an example embodiment where the ASD process and the pattern transfer etch used to form the patterned underlying layer are single step processes. As mentioned above, in some other embodiments, a method 300 may be used in which a cyclic deposition and etch process is performed in a plasma chamber to pattern an underlying layer disposed adjacent below a patterned MBR layer. FIG. 3 illustrates a flowchart of the method 300, and FIGS. 4A-4F illustrate cross-sectional views of a semiconductor device at various intermediate stages of fabrication of an example method 300 using the cyclic process.

Figure 4A:
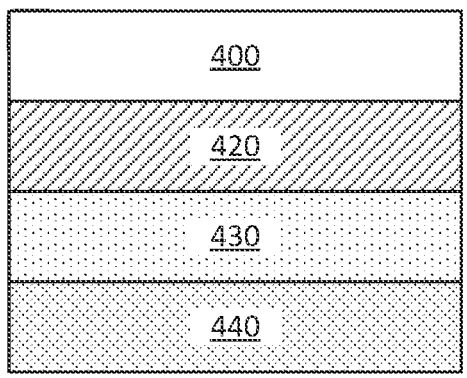
FIGS. 4A-4F illustrate cross-sectional views of a semiconductor device at various intermediate stages of processing for patterning an underlying layer using the method described in the flowchart illustrated in FIG. 3.

Similar to method 100, method 300 forms an MBR layer 400 on an underlying layer 420, as indicated in box 310 in FIG. 3 and in cross-sectional view in FIG. 4A. The MBR layer 400 is a first mask material that is patterned using EUV lithography (box 320 in FIG. 3), same as in method 100. The patterned MBR layer forms a first masking layer 410, illustrated in FIG. 4B. The first masking layer 410 and the underlying layer 420 may be using materials similar to those used for the first masking layer 210 and the underlying layer 220, described above. Likewise, the base layer 430 and substrate layer 440 in FIGS. 4A-4F are similar to the base layer 230 and substrate layer 240 in FIGS. 2A-2D.

Figure 4B:
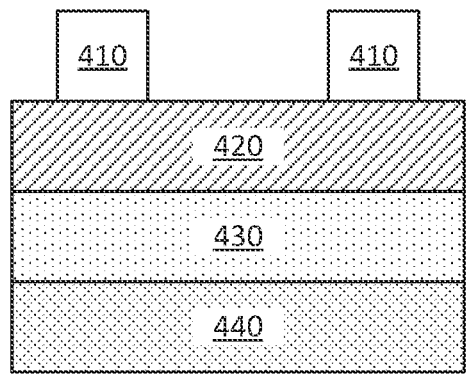

The underlying layer 420 in FIG. 4B is patterned using a cyclic process 370 in the flowchart of method 300, illustrated in FIG. 3. As indicated in boxes 340 and 360, each cycle of the cyclic process comprises depositing a second mask material selectively on the first masking layer by exposing the substrate to a first plasma (box 340) and etching a portion of the underlying layer by exposing the substrate to a second plasma (box 360). The materials and plasma processing used for depositing the second mask material and etching the underlying layer in method 300 are similar to those described above for method 100. In other words, the process steps in boxes 340 and 360 are similar to those in boxes 140 and 160, respectively.

Figure 4C:
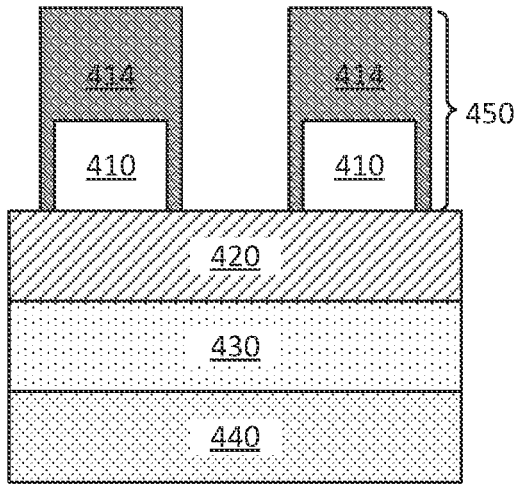
Figure 4D:
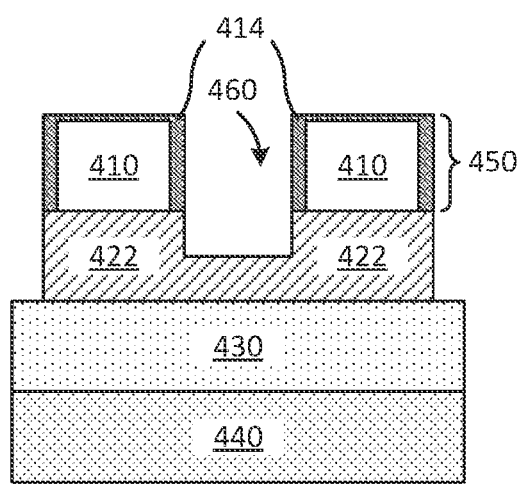

FIGS. 4C and 4D illustrate cross-sectional views of the substrate during a first cycle of the cyclic process 370 in FIG. 3. In FIG. 4C, a second masking layer 414 has been formed using the chemical selectivity of the first plasma (box 340). The etch mask 450 comprising the first masking layer 410 and the second masking layer 414 is then used to perform the etch step (box 360) using etchants in the second plasma. As illustrated in FIG. 4D, at the end of the first cycle, the second mask material of the second masking layer 414 is almost completely depleted while the patterning of the underlying layer 420 is still incomplete. A partially etched underlying layer 422, illustrated in FIG. 4D, shows that the bottom of a cavity 460 has not yet exposed a surface of the base layer 430 below the partially etched underlying layer 422.

Figure 4E:
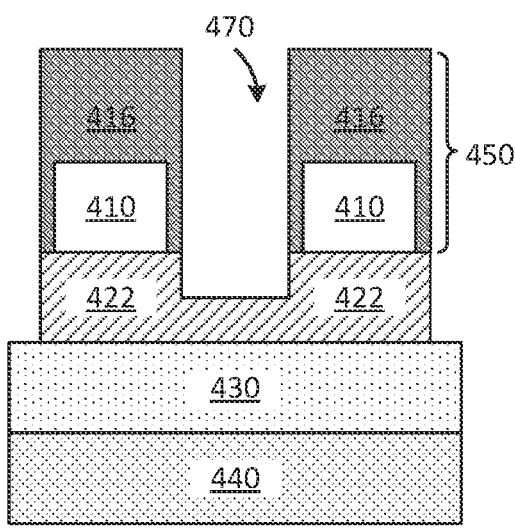
Figure 4F:
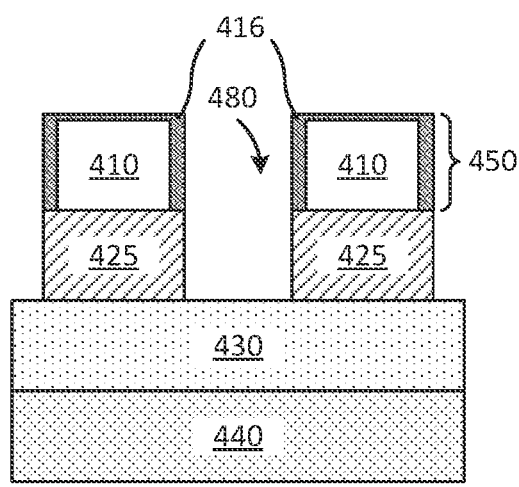

Referring now to FIGS. 4E and 4F, more of the second mask material is deposited selectively in next cycle of the cyclic process to form a second masking layer 416 to rebuild the etch mask 450, as illustrated in FIG. 4E. In FIG. 4F, the etch step (box 360) has completed patterning the partially etched underlying layer 422 to form the patterned underlying layer 425. In this example of method 300, two cycles of the cyclic process 370 were sufficient to complete forming the patterned underlying layer 425. In some other example embodiment, a larger number of cycles may be performed. In various embodiments, the number of cycles may be from two to ten.

FIGS. 5 and FIGS. 6A-6F illustrate a flowchart and cross-sectional views of a semiconductor device at various intermediate stages of fabrication of yet another embodiment. In the example embodiment described with reference to FIG. 5 and FIGS. 6A-6F, a patterned lithography stack that may be used as an etch mask is formed on a base layer. A pattern transfer etch is performed to transfer the pattern of the patterned lithography stack to the base layer. First, a lithography stack having a top MBR layer is deposited, and the MBR layer is patterned using EUV lithography to expose a portion of an underlying layer adjacent below the MBR layer. Then a plasma deposition process is performed that forms an overlying layer over the top of the patterned MBR layer and over the top of the portion of the underlying layer exposed by the patterned MBR layer. However, the plasma chemistry is selected to deposit material preferentially over the patterned MBR layer. Thus, although the overlying layer covers the entire top surface of the substrate, a first thickness of the overlying layer on top of the MBR layer is greater than a second thickness of the overlying layer on top of the underlying layer exposed by the patterned MBR layer. In this embodiment, after depositing the overlying layer, a plasma etch process is performed in the plasma chamber to remove a portion of the overlying layer to again expose the portion of the underlying layer that was exposed previously when the MBR layer was patterned. The plasma etch process is controlled to utilize the difference between the first thickness and the second thickness to ensure that the patterned MBR layer remains covered by the overlying layer.

As shown in the cross-sectional view in FIG. 6A, a lithography stack comprising an MBR layer 600 and an underlying layer 620 (disposed adjacent below the MBR layer 600) has been formed (box 510 in FIG. 5) on a base layer 630 of a substrate. The flowchart illustrated in FIG. 5 describes a method 500 for patterning the lithography stack. First, the MBR layer 600 is patterned using EUV lithography (box 520) to form a patterned MBR layer 610 and expose a surface of a portion of the underlying layer 620, as illustrated in FIG. 6B.

Figure 5:
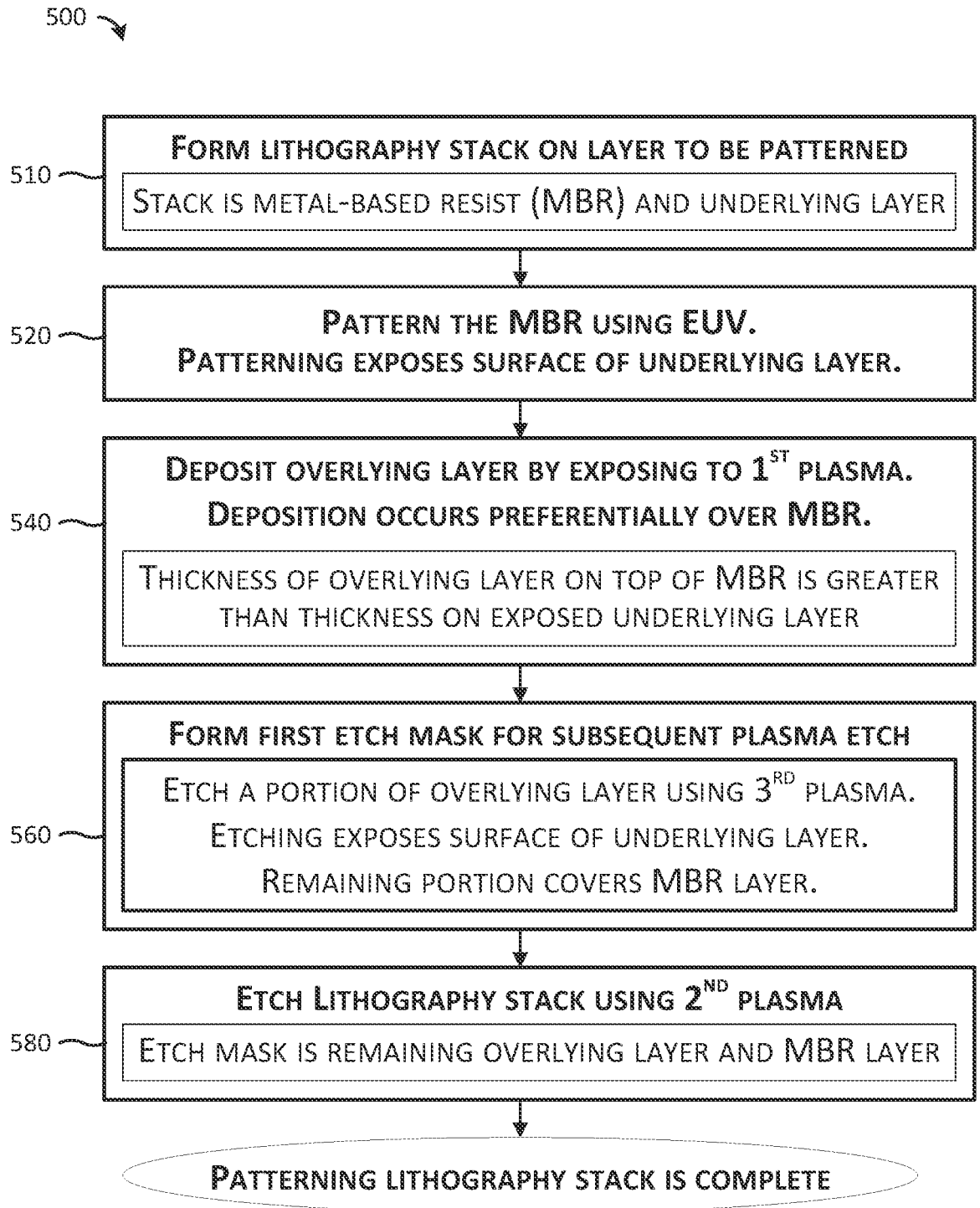
FIG. 5 illustrates a flowchart of a method for patterning a lithography stack, in accordance with some embodiment.
Figure 6A:
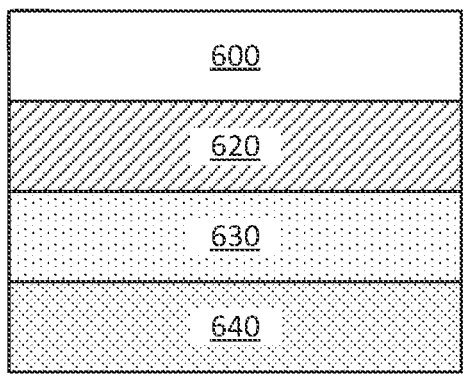
FIGS. 6A-6F illustrate cross-sectional views of a semiconductor device at various intermediate stages of processing for patterning a lithography stack using the method described in the flowchart illustrated in FIG. 5.
Figure 6B:
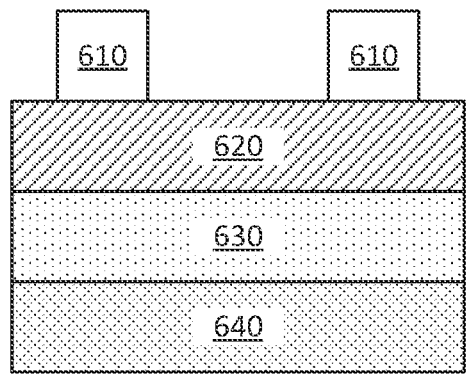
Figure 6C:
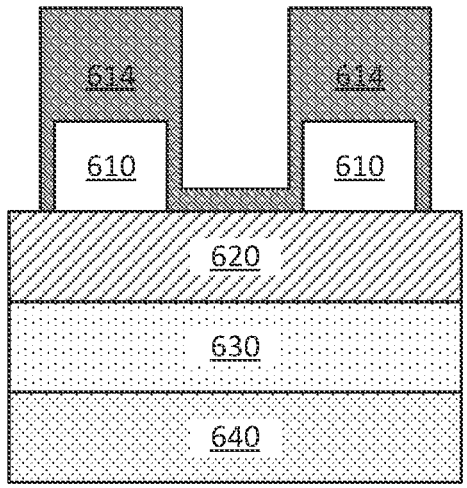

The substrate is then transferred to a plasma chamber where an overlying layer is deposited using a first plasma, as indicated in box 540 in FIG. 5. The first plasma in method 500 is using materials and processes similar to those used to generate the first plasma in method 100, described above with reference to FIG. 1. The substrate is exposed to the first plasma to deposit material preferentially over the top surface of the patterned MBR layer 610 relative to the exposed surface of the portion of the underlying layer 620. The preferential deposition process forms the overlying layer 614 (box 540), seen in the cross-sectional view in FIG. 6C. As illustrated in FIG. 6C, the overlying layer 614 has a first thickness over a top surface of the patterned MBR layer 610 and a second thickness covering the exposed surface of the underlying layer 620. Because of the preferential chemical reaction of the first plasma over the patterned MBR layer relative to the underlying layer 620, the first thickness is greater than the second thickness, as illustrated in the cross-sectional view in FIG. 6C.

Figure 6D:
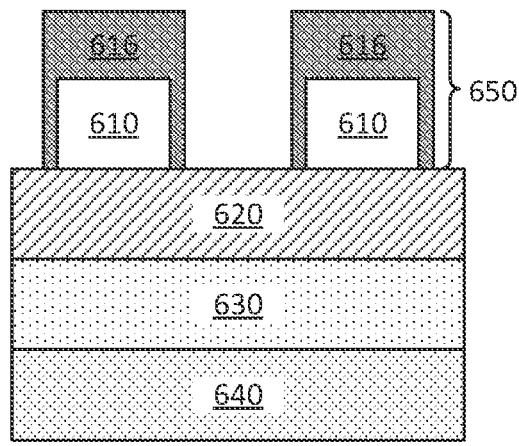
Figure 6E:
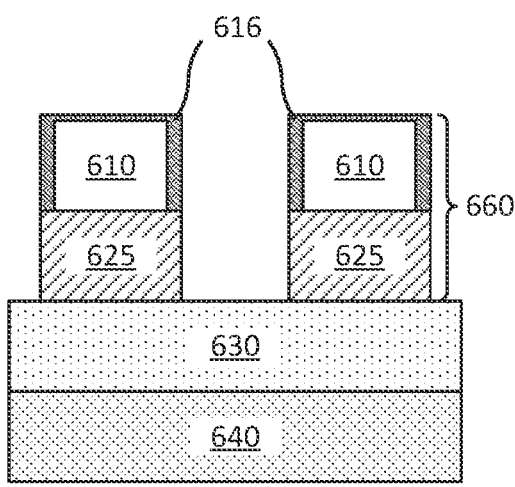

As indicated in box 560 of the flowchart for method 500 illustrated in FIG. 5, a portion of the overlying layer 614 is removed by exposing the substrate to a plasma in the plasma chamber, referred to as a third plasma. The third plasma comprises etchants suitable to remove a portion of the overlying layer 614 to expose the underlying layer 620. The etched overlying layer 616 is illustrated in the cross-sectional view in FIG. 6D. As illustrated in FIG. 6D, the plasma etch has been adjusted to again expose the surface of the underlying layer 620 that was covered by the overlying layer 614 (see FIG. 6C). The remaining portion, which is the overlying layer 616, is seen covering the patterned MBR layer 610. The remaining portion of the overlying layer 616 and the patterned MBR layer 610 form a first etch mask 650, illustrated in FIG. 6D.

The etchants used for removing a portion of the overlying layer 614 may comprise fluorocarbons, fluorine, chlorine, or hydrogen bromide if the overlying layer 614 comprises a silicon-based material. Embodiments where the overlying layer 614 comprises an organic material, the etchant may comprise CO, $CH_4$, $CO_2$, $O_2$, or the like. It is noted that the etch chemistry is similar to the etch chemistry used for the trim etch process, mentioned above. However, some of the process parameters for the plasma etch process used in etching the portion of the overlying layer 614 may be different from those in the plasma etching process used for the trim etch described above because the two processes may be tuned for different etch profile and etch selectivity.

The first etch mask 650 (see FIG. 6D and box 560 in flowchart of method 500) is the etch mask for patterning the underlying layer 620. As indicated in box 580 of the flowchart for method 500 illustrated in FIG. 5, the underlying layer 620 is etched using a second plasma generated in the plasma chamber. The second plasma comprises etchants suitable to remove the underlying layer 620 of the lithography stack. Accordingly, the second plasma used in the method 500 may be similar to the second plasma described above for the methods 100 (see FIG. 1 box 160 and FIG. 2D) and 300 (see FIG. 3 box 360 and FIGS. 4D-4F). The substrate is exposed to the second plasma (box 58o) to etch the material of the underlying layer 620 to form a patterned underlying layer 625. This completes patterning the lithography stack, thereby forming a patterned lithography stack 660, illustrated in FIG. 6E.

Figure 6F:
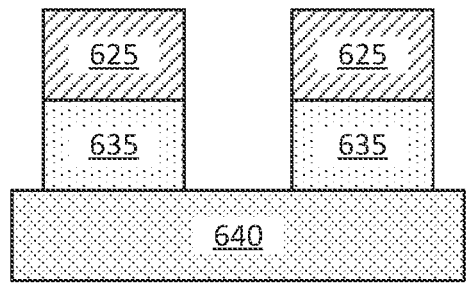

Subsequently, the patterned lithography stack 660 may be used as a second etch mask, to pattern a portion of the base layer 630 to form a patterned base layer 635, as illustrated in FIG. 6F. In various embodiments, the base layer 630 may comprise silicon dioxide, carbon doped oxide, fluorosilicate glass, porous oxide, silicon nitride, silicon oxynitride, silicon, titanium nitride, titanium, tantalum nitride, tantalum, or a combination thereof. Appropriate etchants may be selected for the pattern transfer etch to remove a portion of the base layer 630 to form the patterned base layer 635. In some embodiments, a plasma etch process (e.g., an anisotropic reactive ion etch (RIE)) may be performed by exposing the substrate to a fourth plasma. In one embodiment, the first plasma, the second plasma, the third plasma, and the fourth plasma may be generated in the plasma chamber without removing the substrate from the plasma chamber.

In the embodiments described above, the combination of the overlying second mask material and the patterned MBR layer form an etch mask that provides greater etch resistance relative to that of the patterned MBR layer alone. This allows the MBR layer to be formed thinner than otherwise. The reduced aspect ratio of the geometries in the patterned resist layer (e.g., narrow lines and features with small area, such as resist pillars and spaces between holes) provides a larger margin to the high aspect ratio limit beyond which the patterning defects associated with tall resist features begin to occur. By using the methods described in this disclosure, MBR layers for EUV lithography may be selected to have the resist aspect ratio reduced by about 50% to as much as 80%. For example, for a pattern designed at a 30 nm pitch, the resist layer thickness may be reduced from a typical 30 nm used for EUV lithography to a thickness range of about 5 nm-20 nm with the techniques described above. Additionally, lines and spaces patterned with the combination etch mask may be smoother. The rms value of line width roughness (LWR), line edge roughness (LER), and space width roughness (SWR) of the patterned features may be reduced by roughly 0.1 nm to about 0.3 nm.

Example 1. A method of forming a semiconductor device includes receiving a substrate in a plasma chamber, the substrate comprising an EUV patterned first mask material comprising a metal-based resist (MBR) and an underlying layer disposed between the substrate and the first mask material; depositing, selectively, a second mask material on the first masking layer using a first plasma comprising a source gas that reacts selectively with the first masking layer relative to the underlying layer; and etching the portion of the underlying layer to form a patterned underlying layer using the second masking layer and the first masking layer as an etch mask.

Example 2. The method of example 1, where the underlying layer includes a silicon-based dielectric.

Example 3. The method of one of examples 1 or 2, further including performing a trim etch process in the plasma chamber to remove a portion of the second mask material.

Example 4. The method of one of examples 1 to 3, where depositing the second masking layer includes a thickness along a sidewall of the first masking layer which is less than a thickness of the second mask material over a top surface of the first masking layer.

Example 5. The method of one of examples 1 to 4, where the second mask material includes silicon or an organic polymer.

Example 6. The method of one of examples 1 to 5, where the source gas comprises SiF4 or CO.

Example 7. The method of one of examples 1 to 6, where the first plasma further includes an additive gas, the additive gas being H2, SiCl4, CH4, CHxF4-x, or a mixture thereof and/or a diluent gas, the diluent gas being Ar, N2, or He.

Example 8. The method of one of examples 1 to 7, where the first plasma further includes an additive gas, the additive gas being H2, CH4, CHxF4-x, CO2, O2, or a mixture thereof.

Example 9. The method of one of examples 1 to 8, where the first masking layer has a first line edge roughness value and the second masking layer has a second line edge roughness value, where the first line edge roughness value is greater than the second line edge roughness value.

Example 10. A method of forming a semiconductor device, the method includes depositing a layer of a first mask material including a metal-based resist (MBR), the layer covering an underlying layer of a substrate; patterning the first mask material using an extreme ultraviolet (EUV) lithography process to form a first masking layer and expose a portion of the underlying layer; and etching the underlying layer using cyclic process that includes: depositing a second mask material selectively on the first masking layer by exposing the substrate to a first plasma, the first plasma including a source gas that reacts selectively with the first masking layer relative to the underlying layer; and exposing the substrate to a second plasma.

Example 11. The method of example 10, where the second mask material includes silicon, and where the first plasma includes the source gas and a diluent gas, the source gas being SiF4 and the diluent gas being Ar, N2, or He.

Example 12. The method of one of examples 10 or 11, where the second mask material includes an organic polymer, and where the first plasma includes the source gas and a diluent gas, the source gas being CO and the diluent gas being Ar, N2, or He.

Example 13. The method of one of examples 10 to 12, where the underlying layer includes spin-on glass (SOG), silicon-containing antireflective coating (SiARC), silicon carbide (SiC), silicon oxycarbide (SiOC), silicon carbonitride (SiCN), silicon oxycarbonitride (SiOCN), organic BARC, or a combination thereof.

Example 14. A method of forming a semiconductor device, the method includes forming a lithography stack on a base layer on a substrate, the stack including a metal-based resist (MBR) layer and an underlying layer disposed below the MBR layer; patterning the MBR layer using an extreme ultraviolet (EUV) lithography process to form a patterned MBR layer and expose a surface of a portion of the underlying layer; depositing an overlying layer by exposing the substrate to a first plasma, the first plasma comprising a source gas that reacts preferentially with the MBR layer relative to the underlying layer, the overlying layer having a first thickness over a substantially flat top surface of the patterned MBR layer and a second thickness covering the exposed surface of the underlying layer, the first thickness being greater than the second thickness; exposing the substrate to a second plasma to etch a portion of the overlying layer to expose the surface of the underlying layer covered by the overlying layer covering the patterned MBR layer; exposing the substrate to a third plasma to etch the lithography stack in the plasma chamber to form a patterned lithography stack using the remaining portion of the overlying layer and the patterned MBR layer as a first etch mask.

Example 15. The method of example 14, further including, using the patterned lithography stack as a second etch mask, etching a portion of the base layer.

Example 16. The method of one of examples 14 or 15, where etching a portion of the base layer includes exposing the substrate to a fourth plasma, the first plasma, the second plasma, the third plasma, and the fourth plasma being generated in the plasma chamber without removing the substrate from the plasma chamber.

Example 17. The method of one of examples 14 to 16, where, after exposing the substrate to the second plasma, a thickness of the overlying layer along a sidewall of the patterned MBR layer is less than a thickness of the overlying layer over a top surface of the patterned MBR layer.

Example 18. The method of one of examples 14 to 17, where the second mask material includes silicon or an organic polymer.

Example 19. The method of one of examples 14 to 18, where the base layer includes silicon dioxide, carbon doped oxide, fluorosilicate glass, porous oxide, silicon nitride, silicon oxynitride, silicon, titanium nitride, titanium, tantalum nitride, tantalum, or a combination thereof.

Example 20. The method of one of examples 14 to 19, where the underlying layer includes spin-on glass (SOG), silicon-containing antireflective coating (SiARC), silicon carbide (SiC), silicon oxycarbide (SiOC), silicon carbonitride (SiCN), silicon oxycarbonitride (SiOCN), organic BARC, or a combination thereof.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a semiconductor device, the method comprising:
   receiving a substrate in a plasma chamber, the substrate comprising a first masking layer comprising a metal-based resist (MBR) and an underlying layer disposed between a substrate layer and the first masking layer;
   depositing selectively, a second masking layer on the first masking layer using a first plasma comprising a source gas that chemically and selectively reacts with the MBR relative to the underlying layer; and
   etching a portion of the underlying layer to form a patterned underlying layer using the second masking layer and the first masking layer as an etch mask.

2. The method of claim 1, wherein the underlying layer comprises a silicon-based dielectric.

3. The method of claim 1, further comprising performing a trim etch process in the plasma chamber to remove a portion of the second masking layer.

4. The method of claim 1, wherein depositing the second masking layer comprises a thickness along a sidewall of the first masking layer which is less than a thickness of the second masking layer over a top surface of the first masking layer.

5. The method of claim 1, wherein the second masking layer comprises silicon or an organic polymer.

6. The method of claim 1, wherein the source gas comprises $SiF_4$ or CO.

7. The method of claim 6, wherein the first plasma further comprises an additive gas, the additive gas being $H_2$, $SiCl_4$, $CH_4$, $CH_xF_{4-x}$, or a mixture thereof and/or a diluent gas, the diluent gas being Ar, $N_2$, or He.

8. The method of claim 6, wherein the first plasma further comprises an additive gas, the additive gas being $H_2$, $CH_4$, $CH_xF_{4-x}$, $CO_2$, $O_2$, or a mixture thereof.

9. The method of claim 1, wherein the first masking layer has a first line edge roughness value and the second masking layer has a second line edge roughness value, wherein the first line edge roughness value is greater than the second line edge roughness value.

10. A method of forming a semiconductor device, the method comprising:
    depositing a layer of a first mask material comprising a metal-based resist (MBR), the layer covering an underlying layer of a substrate;
    patterning the first mask material using an extreme ultraviolet (EUV) lithography process to form a first masking layer and expose a portion of the underlying layer; and
    etching the underlying layer using a cyclic process comprising:
      depositing a second masking layer selectively on the first masking layer by exposing the substrate to a first plasma, the first plasma comprising a source gas that chemically and selectively reacts with the MBR relative to the underlying layer; and
      exposing the substrate to a second plasma.

11. The method of claim 10,
    wherein the second masking layer comprises silicon, and
    wherein the first plasma comprises the source gas and a diluent gas, the source gas comprising $SiF_4$ and the diluent gas comprising Ar, $N_2$, or He.

12. The method of claim 10,
wherein the second masking layer comprises an organic polymer, and
wherein the first plasma comprises the source gas and a diluent gas, the source gas comprising CO and the diluent gas comprising Ar, $N_2$, or He.

13. The method of claim 10, wherein the underlying layer comprises spin-on glass (SOG), silicon-containing antireflective coating (SiARC), silicon carbide (SiC), silicon oxycarbide (SiOC), silicon carbonitride (SiCN), silicon oxycarbonitride (SiOCN), organic BARC, or a combination thereof.

14. A method of forming a semiconductor device, the method comprising:
forming a lithography stack on a base layer on a substrate, the lithography stack comprising a metal-based resist (MBR) layer and an underlying layer disposed below the MBR layer;
patterning the MBR layer using an extreme ultraviolet (EUV) lithography process to form a patterned MBR layer and expose a surface of a portion of the underlying layer;
depositing an overlying layer by exposing the substrate to a first plasma, the first plasma comprising a source gas that chemically and preferentially reacts with the patterned MBR layer relative to the underlying layer, the overlying layer having a first thickness over a top surface of the patterned MBR layer and a second thickness covering the exposed surface of the underlying layer, the first thickness being greater than the second thickness;
exposing the substrate to a second plasma to etch a portion of the overlying layer to expose the surface of the underlying layer covered by the overlying layer, a remaining portion of the overlying layer covering the patterned MBR layer; and
exposing the substrate to a third plasma to etch the lithography stack in a plasma chamber to form a patterned lithography stack using the remaining portion of the overlying layer and the patterned MBR layer as a first etch mask.

15. The method of claim 14, further comprising, using the patterned lithography stack as a second etch mask, etching a portion of the base layer.

16. The method of claim 15, wherein etching the portion of the base layer comprises exposing the substrate to a fourth plasma, the first plasma, the second plasma, the third plasma, and the fourth plasma being generated in the plasma chamber without removing the substrate from the plasma chamber.

17. The method of claim 14, wherein, after exposing the substrate to the second plasma, a thickness of the overlying layer along a sidewall of the patterned MBR layer is less than a thickness of the overlying layer over a top surface of the patterned MBR layer.

18. The method of claim 14,
wherein the overlying layer comprises silicon or an organic polymer.

19. The method of claim 14, wherein the base layer comprises silicon dioxide, carbon doped oxide, fluorosilicate glass, porous oxide, silicon nitride, silicon oxynitride, silicon, titanium nitride, titanium, tantalum nitride, tantalum, or a combination thereof.

20. The method of claim 14, wherein the underlying layer comprises spin-on glass (SOG), silicon-containing antireflective coating (SiARC), silicon carbide (SiC), silicon oxycarbide (SiOC), silicon carbonitride (SiCN), silicon oxycarbonitride (SiOCN), organic BARC, or a combination thereof.

* * * * *